(12) United States Patent
Alexandersson

(10) Patent No.: US 6,466,114 B1
(45) Date of Patent: Oct. 15, 2002

(54) RESONATOR WITH VARIABLE RESONANCE FREQUENCY

(75) Inventor: Mats Alexandersson, Göteborg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/522,399

(22) Filed: Mar. 9, 2000

(30) Foreign Application Priority Data

Mar. 9, 1999 (SE) ................................. 9900850

(51) Int. Cl.$^7$ .............................. H03H 5/12; H03J 3/02; H03J 3/06; H03J 5/04; H03J 5/02
(52) U.S. Cl. ......................... 334/14; 333/174; 334/15; 334/64; 334/78; 455/179.1; 455/180.4
(58) Field of Search .......................... 333/174; 334/15, 334/14, 64, 78; 455/179.1, 180.4

(56) References Cited

U.S. PATENT DOCUMENTS

| | | | | |
|---|---|---|---|---|
| 5,291,159 A | * | 3/1994 | Vale ............................ | 333/188 |
| 5,379,008 A | | 1/1995 | Bockelman et al. ......... | 333/172 |
| 5,392,011 A | * | 2/1995 | Li ............................... | 333/174 |
| 6,084,486 A | * | 7/2000 | Suzuki et al. ................ | 333/174 |

FOREIGN PATENT DOCUMENTS

| | | |
|---|---|---|
| GB | 2 241 846 A | 9/1991 |
| GB | 2 274 034 A | 7/1994 |
| GB | 2 276 786 A | 10/1994 |

* cited by examiner

*Primary Examiner*—David E. Graybill
(74) *Attorney, Agent, or Firm*—Nixon & Vanderhye P.C.

(57) ABSTRACT

The invention relates to a resonator (200,300) with variable resonance frequency, intended for connection to an amplifier, thus forming an oscillator, said resonator comprising a resonator circuit (205,305) for deciding the resonance frequency of the resonator and the oscillator, said resonator circuit comprising an inductance (L), a variable capacitance ($C_j$), and means ($V_{tune}$) for varying the capacitance. The resonator also comprises connection means ($C_1$, $C_k$; $C_1$, $C_k$, $C_2$) for connecting the resonator to an amplifier. The resonator is provided with means ($V_{tune}$) for varying the capacitance of the connection means in proportion to the variation of the capacitance ($C_j$) of the resonator circuit. Preferably, the means ($V_{tune}$) for varying the capacitance ($C_k$) of the connection means are arranged such that an essentially constant relationship ($C_k/C_j$) is maintained between the capacitance ($C_k$) of the connection means and the first capacitance ($C_j$) of the resonator across all resonance frequencies.

12 Claims, 5 Drawing Sheets

RESONATOR WITH VARIABLE RESONANCE FREQUENCY

TECHNICAL FIELD

The present invention relates to a resonator having variable resonance frequency and high Q-value, primarily intended for use on microwave frequencies and realized in MMIC-technology.

PRIOR ART

Resonators are a type of circuit which are common, for example, in oscillators, an oscillator often being formed by connecting a resonator to an amplifier. A resonator, as the name implies, usually comprises a resonator circuit, the resonance frequency of which decides the resonance frequency of the resonator and thus also of an oscillator formed by connecting the resonator to an amplifier.

A common requirement of an oscillator, and hence of the resonator belonging to the oscillator, is that it should be tunable, in other words that its resonance frequency should be able to be varied, across a broad frequency range. A further requirement is that the oscillator, across the whole of its frequency range, should have a high and relatively constant so-called Q-value, which, inter alia, gives the oscillator a low and even phase noise level. A precondition for achieving this is that the impedance of the resonator at its resonant frequency is relatively constant across its entire range of resonant frequencies. The resonant frequency is defined as the frequency for which the group delay has its maximum value.

Document GB 2 274 034 discloses a tunable voltage controlled oscillator with a circuit for connecting a tuning voltage to a resonator circuit, and does not disclose any means for keeping the impedance of the resonator at the resonant frequency constant across its range of resonant frequencies.

SUMMARY OF THE INVENTION

The problem which is solved by the present invention is therefore that of producing a resonator, the resonance frequency of which can be varied across a wide frequency range with essentially maintained impedance at its resonant frequency across its range of resonant frequencies.

This problem is solved according to the invention by means of a resonator with variable resonance frequency, intended for connection to an amplifier in order to form an oscillator with variable oscillation frequency, said resonator comprising a resonator circuit for deciding the resonance frequency of the resonator and thereby the oscillation frequency of the oscillator. The resonator circuit comprises at least a first inductance, at least a first variable capacitance, and means for varying the first capacitance. The resonator also comprises connection means for connecting the resonator to the amplifier, and is provided with means for varying the capacitance of the connection means in proportion to the variation of the first capacitance of the resonator circuit.

As stated above, it is desirable that a resonator according to the invention should have essentially constant impedance at resonance across the whole of its frequency range. Since the capacitance of the connection means according to the invention can be varied in proportion to the variance of the first capacitance of the resonator circuit, the impedance of the resonator can be kept essentially constant across the whole of the frequency range of the resonator. This is preferably achieved by the means for varying the capacitance of the connection means being arranged such that across all resonance frequencies, an essentially constant relationship is maintained between the capacitance of the connection means and the first capacitance of the resonator.

A further requirement of a resonator is that it should be screened from direct-current voltage components from an amplifier or other external devices to which the resonator is connected. This requirement is suitably achieved by having the connection means also comprise a non-variable capacitance.

The first capacitance of the resonator circuit preferably comprises two antiserially connected varactor diodes, which in their reverse directions are connected to a so-called sweep voltage, which is varied in order to get the combined capacitance of the varactor diodes to vary, thereby enabling the resonance frequency of the resonator circuit to be varied. Since the two varactor diodes are connected antiserially in relation to one another, the possibility is given of varying the resonance frequency across a very wide range, since the antiserial connection allows a very high alternating-current voltage across the varactor diodes without these starting to limit the signal amplitude by conducting current in their forward directions.

Suitably, the variable capacitance in the means for connecting the resonator to an amplifier also comprises a varactor diode, which in its reverse direction is connected to a sweep voltage which is varied in order to get the capacitance of the connection means to vary. That this varactor diode should be connected to the sweep voltage in its reverse direction is due to the fact that the intention is to use the varactor diode as a variable capacitance.

Since the capacitance of the varactor diode in the connection means, according to the invention, is varied in proportion to the variance of the first capacitance of the resonator circuit, the impedance of the resonator will be able to be kept essentially constant regardless of the changes to its resonance frequency. Since the varactor diode in the connection means also, as a result of its capacitance, will affect the resonance frequency of the resonator, it is advantageous if the sweep voltage to which the varactor diode in the connection means is connected is the same sweep voltage as that of the two antiserially connected varactor diodes in the first capacitance of the resonator.

The magnitude of the connection capacitance in a resonator according to the invention can be chosen relatively freely in relation to the first capacitance of the resonator circuit, since it is variable and since its size can be chosen independently from the size of the first capacitance of the resonator circuit pair.

In a resonator circuit in a resonator according to the invention, the first inductance can either be parallel-connected to the first capacitance or connected in series thereto. These variants of the invention will be described in greater detail below in the following sections of the present description.

The resonator according to the invention is preferably, but not necessarily, realized in MMIC-technology.

DESCRIPTION OF THE FIGURES

The invention will be described in greater detail below through the use of examples of embodiments and with reference to the appended drawings, in which.

PREFERRED EMBODIMENTS

Figure 1:
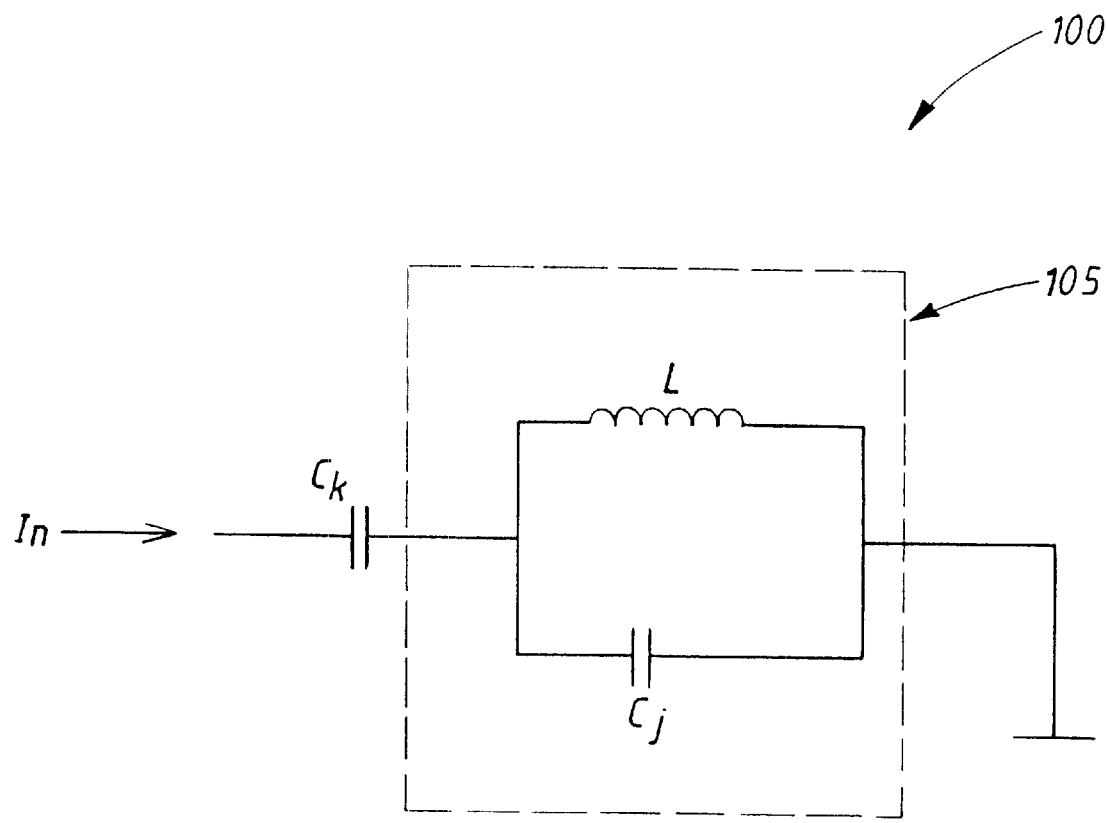
FIG. 1 shows a basic diagram of a traditional resonator.

For the purpose of facilitating the understanding of the continued description of the present invention, FIG. 1 shows a basic diagram of a traditional resonator 100. The resonator 100 comprises a resonator circuit 105 which in turn comprises an inductance L, and a capacitance $C_j$ connected in parallel to the inductance. The resonator further comprises a so-called connection capacitance $C_k$, in other words a capacitance by which the resonator 100 is intended to be connected to external devices. That a capacitance is used to connect the resonator to external devices is mainly due to the fact that it is desirable to screen the resonator from direct-current voltages.

The resonant frequency of the resonator 100 is mainly determined by the resonator circuit 105. In an oscillator, it is desired to have the oscillation frequency equal to the resonant frequency of the resonator 105. For this frequency, the group delay of the resonator 100 will have its maximum value. Since Ck is the coupling means of resonator 105 to the amplifier, the impedance of the resonator 100, looking through Ck, needs to be matched to the amplifier.

The impedance of the resonator 100 at the resonant frequency of the resonator 105 is determined to a great extent by the value of Ck, but also by the values of Cj and L. From this, it will be realized that by varying the size of the capacitance Ck, the impedance locus of the resonator 100 at the resonance frequency of resonator 105 can be varied. It will also be realized that by varying Cj, the resonance frequency of the resonator 105 can be varied, but that this will also cause a change to the impedance of the resonator 100, which, as has been explained, is undesirable.

A more constant impedance of the resonator 100 at the resonant frequency of the resonator 105 can be achieved if, at the same time as Cj is varied to vary the resonance frequency, Ck is also varied to vary the coupling.

Figure 2A:
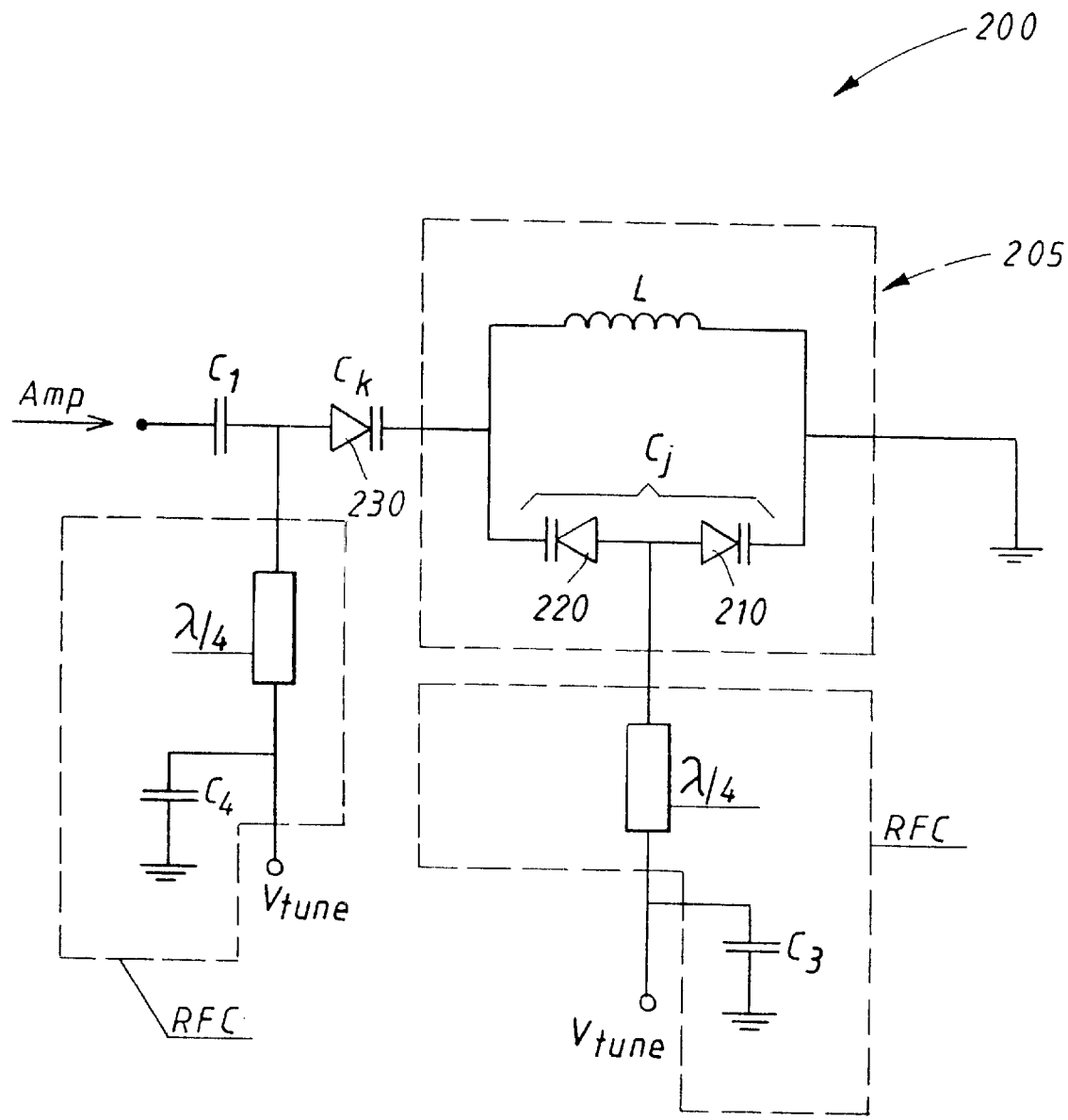
FIGS. 2a and 2b show equivalent circuit diagrams of an embodiment of a resonator according to the invention.

FIG. 2a shows a resonator 200 according to the invention. As can be seen from FIG. 2a, the resonator 200 comprises a resonator circuit 205, which in turn comprises a coil L connected in parallel to a capacitance $C_j$. The capacitance $C_j$ comprises two antiserially connected varactor diodes 210, 220. The capacitance $C_j$ is varied by means of a so-called sweep voltage, $V_{tune}$, which is connected to the diodes in their respective reverse direction. The use of two antiserially connected varactor diodes means that it is possible to vary the capacitance $C_j$ without the diodes starting to limit the signal amplitude by conducting current in their forward directions.

The two varactor diodes 210, 220 can be connected antiserially one to the other in two ways, either with the anodes connected one against the other or with the cathodes connected one against the other, the essential factor for the functioning according to the invention being that said varactor diodes are antiserially connected and connected to the sweep voltage in their reverse directions.

The device 200 according to the invention further comprises a means for connecting the resonator to an amplifier in order to form an oscillator, as indicated at the point referred to as "Amp". As is shown in FIG. 2a, this means preferably comprises a non-variable capacitance $C_1$ connected to a varactor diode $C_k$. The capacitance of the varactor diode $C_k$ can be varied by means of a sweep voltage, $V_{tune}$, to which the varactor diode $C_k$ is connected in its reverse direction. Since it is a requirement that the resonator 200 should have essentially the same impedance across all resonance frequencies, the variable connection capacitance $C_k$ is suitably connected to the same sweep voltage as is used to vary the capacitance Cj. As a result of such a connection, and the initial selection of varactor diode sizes for Ck and Cj, the relationship Ck/Cj will be essentially the same across all resonance frequencies, whereby the requirement to keep the impedance of the resonator essentially constant across all resonance frequencies is satisfied.

The non-variable capacitance $C_1$ in the means for connecting the resonator to an amplifier has the function of further blocking the resonator from direct-current voltages.

As can be seen from FIG. 2a, the sweep voltages are connected by so-called RFCs, Radio Frequency Chokes. These are quarter-wavelength transformers, transforming a low impedance to present a high-impedance connection to the circuit, which are used to supply direct-current voltage and to block alternating-current voltage outwards from the resonator. The low impedance to ground at the outer end of the chokes is ensured by means of an additional capacitance C3, C4. This ensures a high impedance at the end of the transformer facing the resonator. For optimal performance, the quarter-wave transformers are centered in the tunable frequency range for the resonator.

Figure 2B:
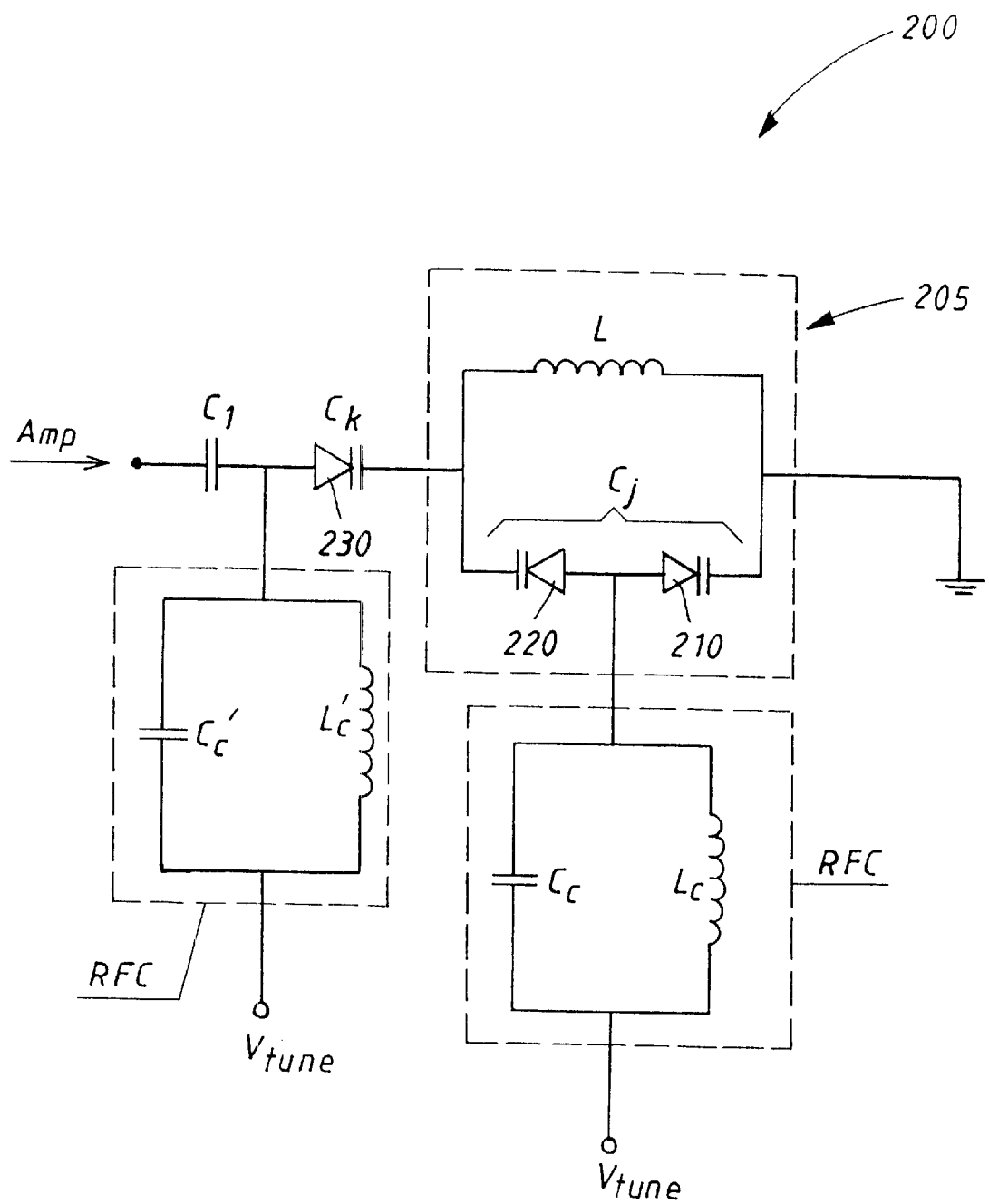

FIG. 2b shows the same resonator 200 as FIG. 2a, but show equivalent circuit diagrams of the RFCs. Functionally, the RFCs in FIG. 2b are equivalent to the description above in connection to FIG. 2a. Their impedance, seen from inside the circuit, will behave as parallel resonance circuits, i.e. a coil Lc, Lc' in parallel with a capacitance C, C'. The resonance frequency of this equivalent circuit equals the frequency for which the quarter-wave transformer is one quarter of a wavelength long.

Figure 3A:
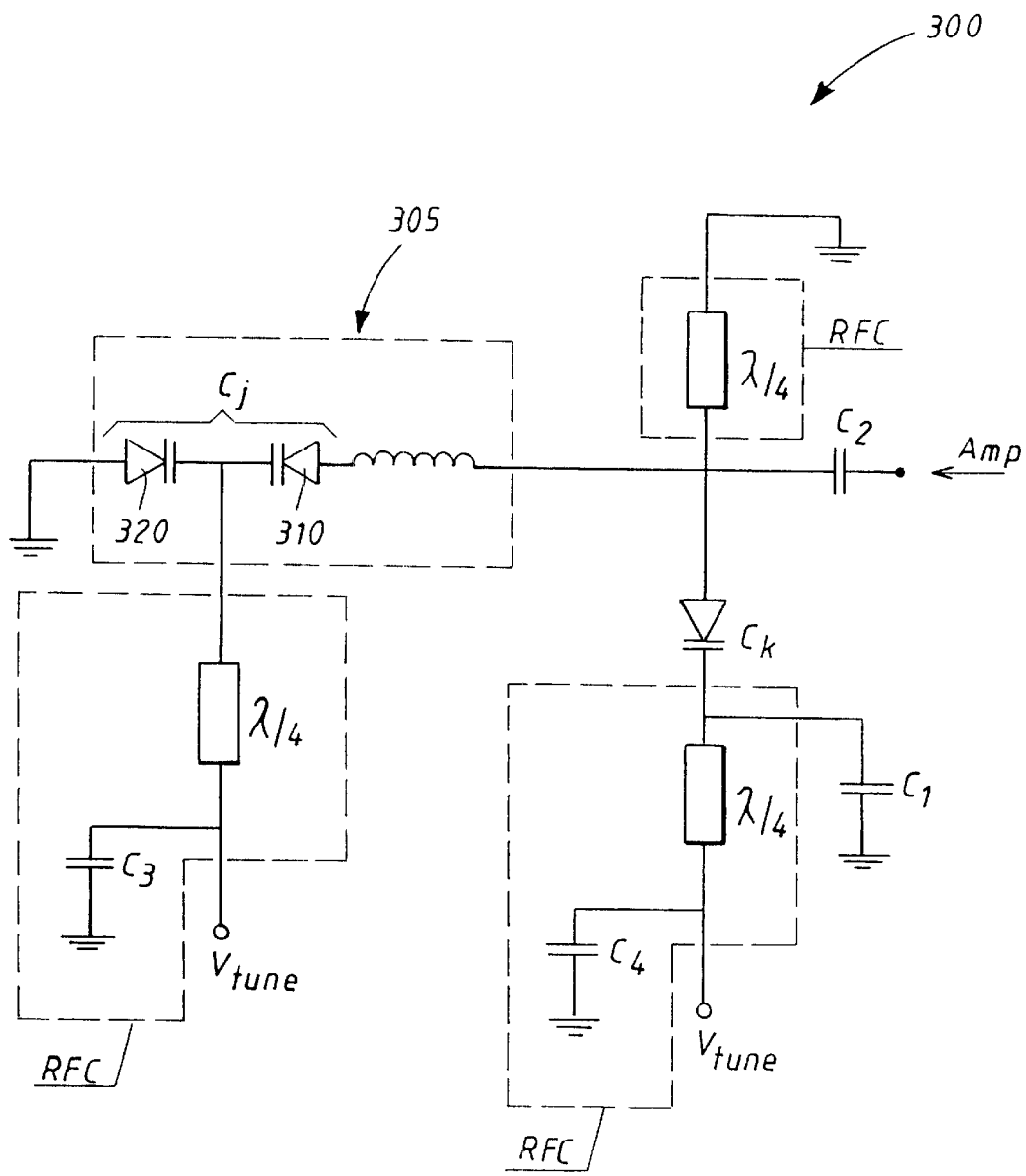
FIGS. 3a and 3b show equivalent circuit diagrams of an alternative embodiment of a resonator according to the invention.

FIG. 3a shows a variant of a resonator 300 according to the invention. The main difference between the resonator 300 and the resonator 200 in FIGS. 2a and 2b is that in the resonator circuit 305 of the resonator 300, the first capacitance $C_j$ of the resonator circuit 305 is connected in series to the coil L, as opposed to the parallel connection of the resonator circuit 205. As in the resonator circuit 205 in FIG. 2, the first capacitance $C_j$ of the resonator circuit 305 comprises two antiserially connected varactor diodes 310, 320, which can be antiserially connected in one of two ways which have been outlined above in connection with the description of the resonator 200 in FIG. 2. The first capacitance $C_j$ is varied by means of a sweep voltage $V_{tune}$, which is connected to the two varactor diodes 310,320 in their respective reverse direction, suitably by an RFC which preferably is designed as the RFCs shown in FIG. 2.

The resonator 300 also comprises means for connecting the resonator to an amplifier in order to form an oscillator, as indicated at the point referred to as "Amp" in FIG. 3.

In this embodiment of the invention as well, the means for connecting the resonator to an amplifier in order to form an oscillator comprises a varactor diode $C_k$ and a non-variable capacitance $C_1$. The capacitance of the varactor diode $C_k$ is varied by means of a sweep voltage to which the diode $C_k$ is connected in its reverse direction. For reasons which have been described in connection with the resonator 200, the connection diode $C_k$ is suitably, but not necessarily, connected to the same sweep voltage $V_{tune}$ as is used to vary the connection capacitance $C_j$. The sweep voltage which is used to vary $C_k$ is preferably connected by an RFC, designed as the other RFCs shown earlier in this description, in other words a capacitance $C_c'$ connected in parallel to a coil $L_c'$, and grounded via a fixed capacitance $C_4$.

The non-variable capacitance $C_1$ in the connection means is connected to ground in order to give an AC-wise ground connection to $C_k$. In addition, the varactor diode $C_k$ in the resonator 300 is connected by its anode to ground so as to produce a DC-ground at this point. The anode is suitably connected to ground by an RFC. The resonator 300 additionally comprises a further non-variable capacitance $C_2$, which also has the function of blocking direct-current voltage. $C_2$ is connected in between the first coil L of the resonator circuit 305 and the connection point "Amp", on the opposite side of the varactor diode $C_k$ in relation to the sweep voltage $V_{tune}$.

Figure 3B:
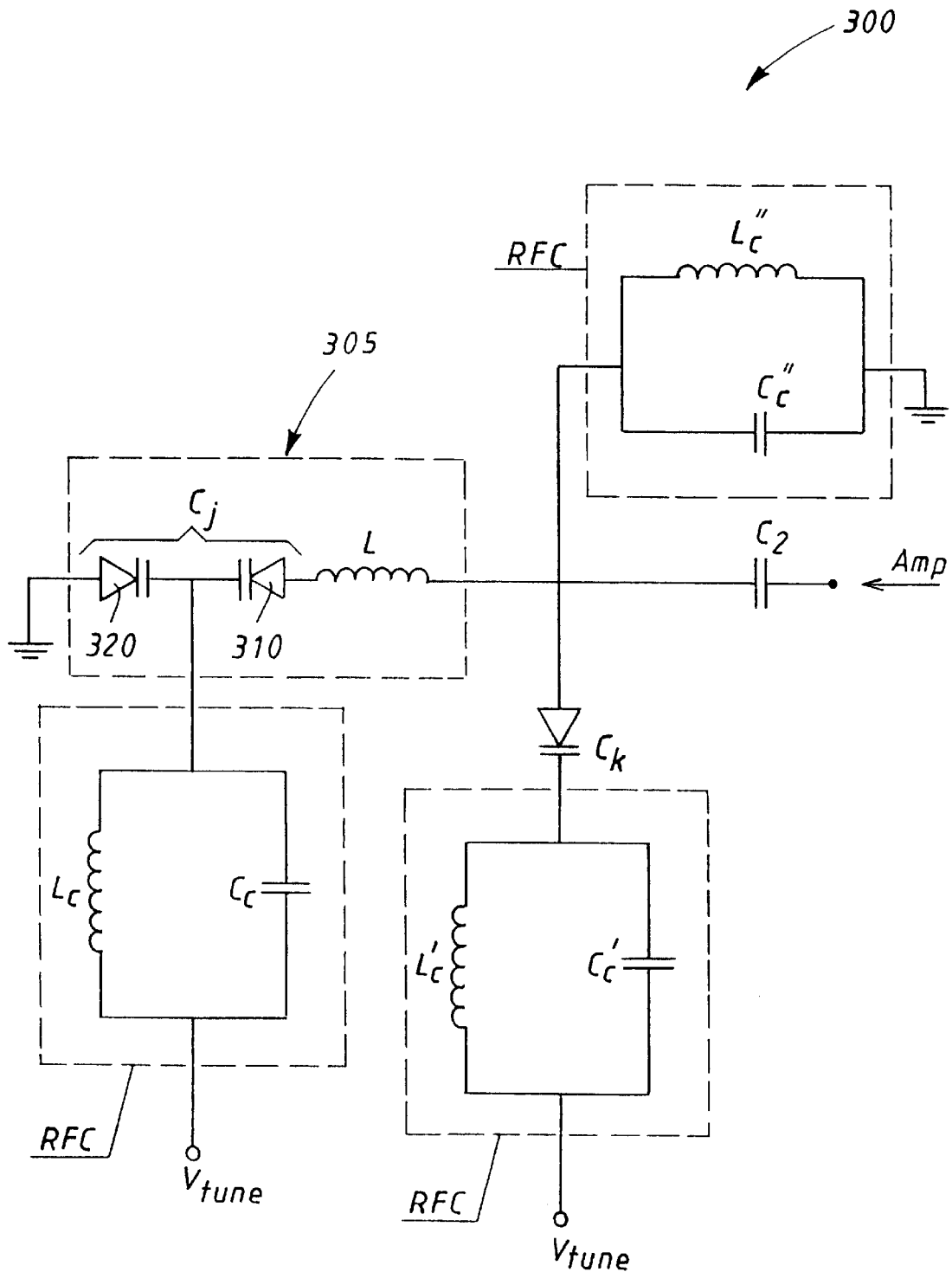

FIG. 3b shows the resonator 300 of FIG. 3a, but with equivalent circuit diagrams for the RFC's, in similarity to the relationship between FIGS. 2a and 2b.

The invention is not limited to the examples of embodiments shown above, but can freely be varied within the scope of the following patent claims. For example, one or more of the variable capacitances belonging to the invention can be constituted by other types of variable capacitances than varactor diodes.

What is claimed is:

1. A resonator with variable resonance frequency, intended for connection to an amplifier in order to form an oscillator with variable oscillation frequency, said resonator comprising:

a resonator circuit for determining the resonance frequency of the resonator and thereby the oscillation frequency of the oscillator, said resonator circuit comprising at least a first inductance (L), at least a first variable capacitance ($C_j$), and means for varying the first capacitance;

connection means for connecting the resonator to said amplifier, said connection means including a capacitance ($C_k$);

means for varying the capacitance ($C_k$) of the connection means in proportion to the variation of the first capacitance ($C_j$) of the resonator circuit;

wherein the means for varying the capacitance ($C_k$) of the connection means is arranged so that an essentially constant relationship ($C_k/C_j$) is maintained between the capacitance ($C_k$) of the connection means and the first capacitance ($C_j$) of the resonator across all resonance frequencies; and wherein voltage via a first terminal is used to vary the capacitance ($C_k$) of the connection means, and voltage via a second terminal is used to vary the first respective ($C_j$) of the resonator circuit, so that different voltages can be used to vary the respective capacitances ($C_k$) and ($C_j$).

2. A resonator (200) according to claim 1, in which the first inductance (L) of the resonator circuit (205) is parallel-connected to the first capacitance ($C_j$).

3. A resonator (300) according to claim 1, in which the first inductance (L) of the resonator circuit (305) is connected in series to the first capacitance ($C_j$).

4. A resonator (200,300) according to claim 1, in which the first capacitance ($C_j$) of the resonator circuit (205,305) comprises two antiserially connected varactor diodes (210, 220; 310, 320), which in their reverse directions are connected to a sweep voltage ($V_{tune}$), by which the combined capacitance of the varactor diodes can be varied.

5. A resonator (200,300) according to claim 1, in which the means for varying the capacitance of the connection means comprises a varactor diode ($C_k$), which in its reverse direction is connected to a sweep voltage ($V_{tune}$) by which the capacitance of the varactor diode can be varied.

6. A resonator (200,300) according to claim 1, in which the means for connecting the resonator circuit (205,305) to an amplifier further comprises means ($C_1$; $C_1$, $C_2$) for screening the resonator circuit from direct-current voltage.

7. A resonator (200,300) according to claim 6, in which the means for screening the resonator circuit (205,305) from the direct-current voltage comprise at least one non-variable capacitance.

8. A resonator with variable resonance frequency comprising:

a resonator circuit for determining a resonance frequency of the resonator and thereby an oscillation frequency of an oscillator, said resonator circuit including a first inductance (L) and a first variable capacitance ($C_j$);

a connection capacitance ($C_k$) for connecting the resonator to an amplifier;

at least one circuit for varying the connection capacitance ($C_k$) in proportion to variation of the first capacitance ($C_j$) of the resonator circuit so that an essentially constant relationship ($C_k/C_j$) is maintained between the connection capacitance ($C_k$) and the first capacitance ($C_j$) of the resonator across all resonance frequencies; and wherein a first sweep voltage from a first terminal is used to vary the connection capacitance ($C_k$) and a second sweep voltage applied via a second terminal is used to vary the first capacitance ($C_j$) of the resonator circuit.

9. The resonator of claim 8, wherein said first variable capacitance ($C_j$) of the resonator circuit includes first and second diodes connected antiserially to one another either anode-to-anode or cathode-to-cathode.

10. The resonator of claim 9, wherein said first and second diodes of said first variable capacitance ($C_j$) are varactor diodes.

11. The resonator of claim 1, wherein said first variable capacitance ($C_j$) of the resonator circuit includes first and second diodes connected antiserially to one another.

12. The resonator of claim 6, wherein said first and second diodes of said first variable capacitance ($C_j$) are varactor diodes, and are connected to said at least one circuit for varying the connection capacitance ($C_k$) in their reverse directions.

* * * * *